ated Examinerstin

United States Patent [19]

Kimoto

[11] 4,353,034
[45] Oct. 5, 1982

[54] FM DETECTING CIRCUIT

[75] Inventor: Yuji Kimoto, Gunma, Japan

[73] Assignees: Sanyo Electric Co., Ltd., Moriguchi; Tokyo Sanyo Electric Co., Ltd., Gunma, both of Japan

[21] Appl. No.: 94,768

[22] Filed: Nov. 16, 1979

[30] Foreign Application Priority Data

May 18, 1979 [JP] Japan .................................. 54-61886

[51] Int. Cl.$^3$ ............................................. H03D 3/00
[52] U.S. Cl. .................................... 329/103; 329/137; 329/140; 455/214
[58] Field of Search ........ 329/103, 110, 137, 140–143; 455/214, 304; 307/233 R; 330/295

[56] References Cited

U.S. PATENT DOCUMENTS

| 3,702,442 | 11/1972 | Janssen et al. | 329/103 |
| 3,866,125 | 2/1975 | Kilian | 329/137 X |
| 3,947,637 | 3/1976 | Seki et al. | 330/295 X |

Primary Examiner—Siegfried H. Grimm
Assistant Examiner—Edward P. Westin
Attorney, Agent, or Firm—Armstrong, Nikaido, Marmelstein & Kubovcik

[57] ABSTRACT

An FM signal is applied to an input of a differential amplifier including a pair of transistors having symmetrical characteristics. A 180° phase shifting circuit is connected between two inputs of the differential amplifier. Accordingly, the inputs of the pair of transistors of the differential amplifier receive the FM signal, as converted into an AM signal. The respective base-emitter rectifying junctions of the pair of transistors each rectify the AM signals, as received. The emitter electrodes of the pair of transistors are commonly connected through a predetermined resistor, with the common connection point being connected to the ground through a capacitor. Accordingly, a smoothing circuit is implemented by the emitter resistor and the capacitor. A load resistor is connected to the collector electrode of one of the pair of transistors, so that a detected output is withdrawn therefrom.

8 Claims, 16 Drawing Figures

FM DETECTING CIRCUIT

BACKGROUND OF THE INVENTION

1. Field of the Invention

The present invention relates to an FM detecting circuit. More specifically, the present invention relates to an FM detecting circuit for converting an FM signal into two AM signals having a phase difference of 180° through a phase shifting circuit and for detecting the respective AM signals and differentially combining the same.

2. Description of the Prior Art

It has been proposed and put into practical use that an FM signal is applied to a phase shifting circuit or a tuning circuit, whereby the same is converted into two AM signals having a phase difference of 180°, whereupon these two AM signals are diode detected and combined to provide a detected output, whereby a low frequency component is withdrawn. One example of such an FM detecting circuit is disclosed in Australian Pat. No. 119,138, which was filed Apr. 27, 1943 as Ser. No. 9103/43, as invented by Paul F. G. Holst and Loren R. Kirkwood and assigned to Amalgamated Wireless (Australasia) Limited, a complete specification being published Oct. 27, 1944.

Figures 1, 2:
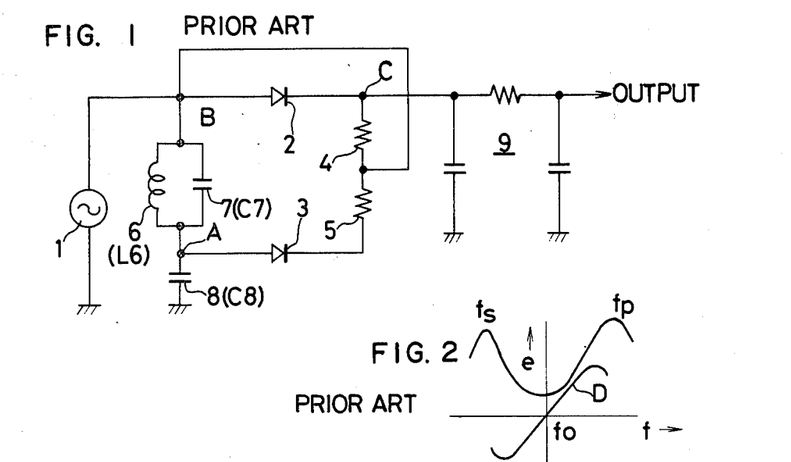
FIG. 1 is a schematic diagram of a conventional FM detecting circuit.
FIG. 2 is a graph showing a detecting characteristic of the FIG. 1 diagram.

FIG. 1 is a schematic diagram for explaining an outline of the invention described in the complete specification of the above described Australian Pat. No. 119,138. Referring to FIG. 1, a voltage source 1 serves as a signal source for providing an FM signal, to which a resonance circuit or a tuning circuit comprising an inductor 6 and capacitors 7 and 8 is connected in parallel. The tuning circuit exhibits a parallel resonance by virtue of the inductor 6 and the capacitor 7 and further exhibits a series resonance by virtue of the inductor 6 and the capacitors 7 and 8. The anodes of diodes 2 and 3 are connected to both ends, i.e. the junctions B and A, respectively, of the parallel circuit of the inductor 6 and the capacitor 7. The diodes 2 and 3 are aimed to make diode detection and the cathodes of these are commonly connected through load resistors 4 and 5, while the junction of the load resistors 4 and 5 is further connected to the anode of the diode 2. The cathode of the diode 2, i.e. the junction C is connected through a de-emphasis circuit 9 to an audio frequency circuit or a low frequency circuit.

The tuning circuit implemented by the inductor 6 and the capacitors 7 and 8 serve as a phase shifting circuit for converting the FM signal into an AM signal. An intermediate frequency voltage or an FM signal voltage appears between the junction A and the ground. The above described voltage is rectified by means of the diode 3 such that a negative voltage is applied to a load resistor 5. The above described negative voltage is applied to both of the cathode and the anode of the diode 2. The diode 2 detects the intermediate frequency voltage appearing between the junction B and the ground, thereby to provide a positive voltage applied to the load resistor 4. As a result, a voltage between the junction C and the ground proves to a sum of the two individual voltages, wherein the value becomes positive, negative or zero depending on the value of the rectified voltage.

FIG. 2 is a graph explaining a detection characteristic achieved by the FIG. 1 circuit, wherein the abscissa indicates the frequency f and the ordinate indicates a response e. A circuit between the junction B and the ground, i.e. the circuit including the inductor 6 and the capacitors 7 and 8, exhibits a double tuning characteristic. More specifically, one tuning characteristic is attributed to parallel resonance by virtue of the inductance L6 of the inductor 6 and the capacitance C7 of the capacitor 7, wherein the impedance between the junction B and the ground becomes the maximum at the frequency fp. Another tuning characteristic is attributed to series resonance by virtue of the inductance L6 of the inductor 6 and the capacitance C7 of the capacitor 7 and the capacitance C8 of the capacitor 8, wherein the impedance between the junction B and the ground becomes the minimum at the frequency fs. The frequency fs of the series resonance is defined by the following equation (1) and the frequency fp of the parallel resonance is defined by the following equation (2), so that the central frequency fo of the FM detecting circuit is defined by the following equation (3).

$$fs = \frac{1}{2\pi \sqrt{L6(C7 + C8)}} \quad (1)$$

$$fp = \frac{1}{2\pi \sqrt{L6 C7}} \quad (2)$$

$$f0 = \frac{1}{2\pi \sqrt{L6\left(C7 + \frac{C8}{2}\right)}} \quad (3)$$

Accordingly, the detecting characteristic of the FIG. 1 circuit is as shown as the curve D in FIG. 2.

An improvement in the FM detecting circuit disclosed in Australian Pat. No. 119,138 has been proposed in German Pat. No. 1906957, for example. German Pat. No. 1906957 was filed Feb. 12, 1969, as invented by Jack Avins and assigned to RCA Corp. (U.S.A.), and published for opposition Sept. 7, 1972.

Figure 3:
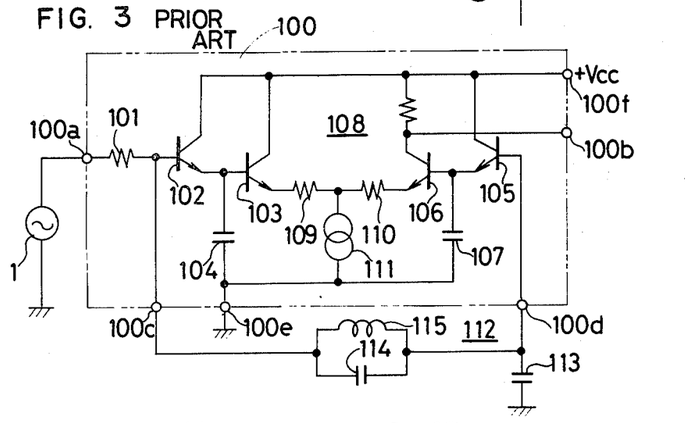
FIG. 3 is a schematic diagram of another conventional FM detecting circuit.

FIG. 3 is a schematic diagram of a major portion for explaining an outline of the invention disclosed in German Pat. No. 1906957.

Referring to FIG. 3, the reference numeral 100 denotes an integrated circuit portion, wherein terminals 100a, 100b, 100c, 100d, 100e and 100f are provided. The connection terminal 100a is connected to receive an FM signal voltage obtained from an FM signal source 1, such as a sound intermediate frequency voltage in a television receiver. The connection terminal 100f is connected to receive a source voltage Vcc. The connection terminal 100e is connected to the ground. The integrated circuit 100 comprises NPN transistors 102, 103 and 105, 106 connected in a symmetrical fashion. The transistors 102 and 105 are aimed to make diode detection by the use of the base-emitter junction thereof, while the transistors 103 and 106 constitute a differential amplifier 108. The input or the base electrode of the detecting transistor 102 is connected to the connection terminal 100a through the resistor 101 and is also connected to the connection terminal 100c. The base electrode of the other detecting transistor 105 is connected to the connection terminal 100d. The collector electrodes of the detecting transistors 102 and 105 are commonly connected to the connection terminal 100f and the emitter electrodes of the same are connected to the base electrodes of the corresponding transistors 103 and 106, respectively. The emitter electrodes of the pair of transistors 103 and 106 constituting the differential amplifier 108 are commonly connected through the emitter resistors 109 and 110, respectively, while a common constant current source 111 is connected between the common connection and the ground, i.e. the connection terminal 100e. Smoothing capacitors 104 and 107 are connected between the emitter electrodes of the detecting transistors 102 and 105, respectively, and the ground, i.e. the connection terminal 100e. A phase shifting circuit 112 is connected between the connection terminals 100c and 100d, externally of the integrated circuit 100. The phase shifting circuit 112 comprises capacitors 113 and 114 and an inductor 115. A parallel resonance circuit is constituted by the capacitor 114 and the inductor 115 and a series resonance circuit is constituted by the capacitor 113 in addition to the above described capacitor 114 and the inductor 115. Accordingly, FM signals as amplitude modulated (hereinafter referred to as AM signals) having a phase difference of 180° are received at the connection terminals 100c and 100d.

Figure 4A:
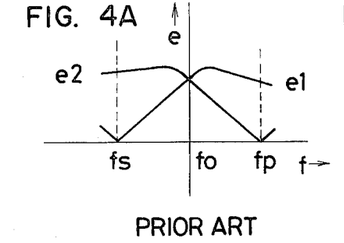
FIGS. 4A and 4B are graphs for explaining the operation of the FIG. 3 detecting circuit.

Accordingly, the intermediate frequency signal voltage obtained from the FM signal source 1 is applied to the detecting transistors 102 and 105 as AM signal voltages having a phase difference of 180° by means of the phase shifting circuit 112. The detecting transistors 102 and 105 each diode detect the respective AM signal voltage by means of the respective base-emitter rectifying junctions. The output voltage as detected by the detecting transistor 102 is smoothed by the capacitor 104 and is applied to the base electrode of one transistor 103 of the differential amplifier 108. On the other hand, the output voltage as detected by the detecting transistor 105 is smoothed by the smoothing capacitor 107 and is applied to the base electrode of the other transistor 106 of the differential amplifier 108. More specifically, the base electrode of the transistor 103 is supplied with the output voltage e1 of the detecting transistor 102 and the base electrode of the transistor 106 is supplied with the output voltage e2 of the detecting transistor 105. These output voltages 31 and e2 are shown in FIG. 4A. As seen in FIG. 4A, these output voltages e1 and e2 are of the same magnitude and of the reversed phase at the central frequency f0 of the detecting circuit. Departing in either side from the central frequency f0, the magnitude of one signal voltage increases, while the magnitude of the other signal voltage decreases, for a prescribed range, so that these contain a substantial phase difference of 180°. The output voltage e1 becomes the minimum at the frequency fs, while the output voltage e2 becomes the minimum at the frequency fp. More specifically, the frequency fp is a series resonance frequency of the phase shifting circuit 112 and the frequency fs is a parallel resonance frequency of the phase shifting circuit 112. Accordingly, assuming that the capacitance of the capacitor 113 is C113, the capacitance of the capacitor 114 is C114 and the inductance of the inductor 115 is L115, then the central frequency f0 of the detecting circuit is defined by the following equation (4).

$$f_0 = \frac{1}{2\pi \sqrt{L115 \left( C114 + \frac{C113}{2} \right)}} \qquad (4)$$

Figure 4B:
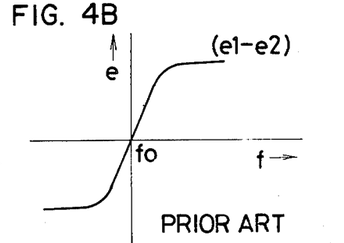

The characteristic of the output from the differential amplifier 108, i.e. the characteristic of the detecting output obtained at the connection terminal 100b of the integrated circuit 100, is shown in FIG. 4B.

The above described German Pat. No. 1906957 is different from the above described Australian Pat. No. 119,138 in the following respects. More specifically, in the Australian Pat. No. 119,138, the AM signals having a phase difference of 180° are individually diode detected and the diode detected outputs are summed up in an analog fashion. By contrast, in the above described German Pat. No. 1906957, the two outputs as diode detected, is subjected to evaluation of a difference therebetween by means of the differential amplifier, whereupon the difference is withdrawn as an output voltage of the detecting circuit. More specifically, in contrast to Australian Pat. No. 119,138, German Pat. No. 1906957 employs a differential amplifier as a characteristic feature.

A counterpart Japanese patent has issued as Japanese Pat. No. 886006. German Pat. No. 1906957 and the Japanese Pat. No. 886006 were granted on those applications filed with a claim to Convention priority based on United States Pat. No. 3,519,944.

As better seen from FIG. 3, German Pat. No. 1906957 employs the smoothing capacitors 104 and 107 in the integrated circuit 100. More specifically, the smoothing capacitors 104 and 107 are formed with a semiconductor junction capacitance of the integrated circuit 100. For this reason, the capacitance values of these capacitors 104 and 107 are liable to be diversified and accordingly the ratio of these capacitances is liable to be asymmetrical. Therefore, the amplitudes of the voltages e1 and e2 applied to the differential amplifier 108 are not necessarily equal to each other. Assuming that the voltages e1 and e2 of different amplitudes are applied to the differential amplifier 108, even in case of a reverse phase of these voltages, a difference AM component is superposed on the output of the differential amplifier 108 and thus on the detected output of the detecting circuit, with the result that an AM suppression characteristic of the FM detecting circuit is degraded. Furthermore, the semiconductor junction capacitances used as the smoothing capacitors 104 and 107 are different from semiconductor chip to semiconductor chip and a detection efficiency is accordingly varied or diversified from integrated circuit to integrated circuit by virtue of such diversified capacitances of the smoothing capacitors. Although capacitance values exceeding a predetermined value are required as those smoothing capacitors 104 and 107 in such detecting circuit, it is difficult or impossible to implement larger capacitances in such detecting circuit as disclosed in German Pat. No. 1906957, wherein semiconductor junction capacitances of the integrated circuit 100 are utilized. Conversely described, in order to achieve a detecting circuit having a sufficient detection efficiency in accordance with the FIG. 3 diagram, it is necessary to increase the capacitance values of the smoothing capacitors 104 and 107, which necessitates an increase of semiconductor junction capacitances constituting these capacitors 104 and 107. In order to increase semiconductor junction capacitances, however, it is necessary to increase the junction areas, as well known, which increases the area of a chip of the integrated circuit 100.

SUMMARY OF THE INVENTION

In short, the present invention comprises a differential circuit having a pair of transistors coupled in a direct current and symmetrical fashion, each including a first, second, and third electrodes, and a phase shifting circuit coupled between the respective inputs of the differential circuit. AM signals of the reverse phases are diode detected by means of the rectifying junctions of the pair of the transistors and a difference of these is also withdrawn from the third electrode of at least one transistor as the output of the detecting circuit. The second electrodes of the pair of transistors are commonly connected directly or through a given resistor component and a filter circuit is connected to the common connection.

In a preferred embodiment of the present invention, the filter circuit comprises a capacitor which is common to the pair of transistors. Accordingly, the direct current symmetry of the pair of transistors constituting the differential circuit is maintained. Accordingly, an AM suppression characteristic is improved as compared with a conventional one.

In a further preferred embodiment of the present invention, the above described common capacitor is implemented as a discrete capacitor component coupled externally of the integrated circuit. Such discrete capacitor can have considerably large capacitance value as compared with a conventional semiconductor junction capacitance value and a diversity of these capacitance values is extremely little. Accordingly, an FM detecting circuit having a stabilized detection efficiency exceeding a predetermined value is provided, wherein such detection efficiency is not different or diversified from chip to chip of the integrated circuit and hence from detecting circuit to detecting circuit.

Accordingly, a principal object of the present invention is to provide an improved FM detecting circuit.

Another object of the present invention is to provide an FM detecting circuit which is free from degradation of an AM suppression characteristic.

A further object of the present invention is to provide an FM detecting circuit of a stabilized detection efficiency.

Still a further object of the present invention is to provide an FM detecting circuit not employing semiconductor junction capacitances of an integrated circuit as smoothing capacitors.

These objects and other objects, features, aspects and advantages of the present invention will become more apparent from the following detailed description when taken in conjunction with the accompanying drawings.

DESCRIPTION OF THE PREFERRED EMBODIMENTS

Figure 5:
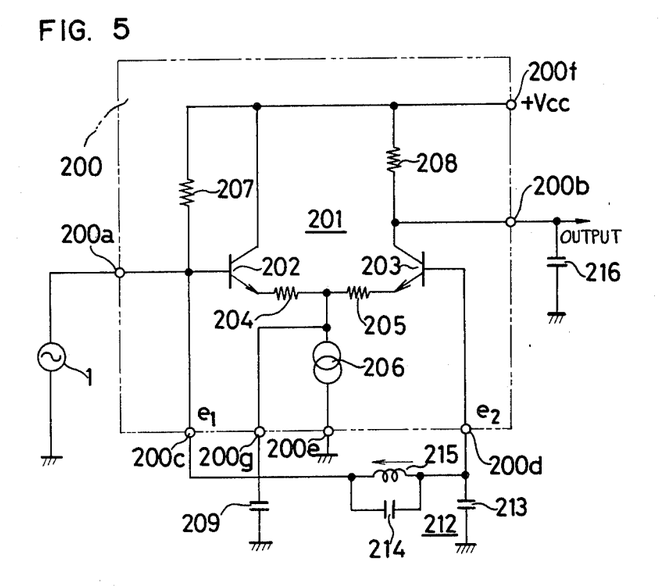
FIG. 5 is a schematic diagram of one embodiment of the present invention.

FIG. 5 is a schematic diagram showing one embodiment of the present invention. The present invention is based on the above described Australian Pat. No. 119,138 (FIG. 1) and is directed to an improvement thereon developed in an aspect different from that in which the above described German Pat. No. 1906957 (FIG. 3) was developed.

Referring to FIG. 5, an FM signal source 1 supplying an FM signal such as an SIF voltage is connected to a connection terminal 200a of an integrated circuit 200. Accordingly, the connection terminal 200a serves as an input terminal of the detecting circuit 200. The integrated circuit 200 further comprises connection terminals 200b, 200c, 200d, 200e, 200f and 200g. The terminal 200b is used as a terminal for withdrawing the detected output to be obtained as to be described subsequently and the terminal 200f is supplied with the source voltage Vcc. The terminal 200e is connected to the ground. The integrated circuit 200 comprises a differential circit 201 implemented by a pair of transistors 202 and 203. The input electrode, i.e. the base electrode of the NPN transistor 202 constituting the differential circuit 201 is connected to the connection terminals 200a and 200c and is also connected through a resistor 207 to the source terminal 200f. The collector electrode of the transistor 202 is connected to the connection terminal 200f. The input electrode, i.e. the base electrode of the other transistor 203 constituting the differential circuit 201 is connected to the connection terminal 200d. The collector electrode of the transistor 203 is connected through a resistor 208 to the source terminal 200f and is also connected from the resistor 208 to the output terminal 200b. The emitter electrodes of these transistors 202 and 203 are commonly connected through emitter resistors 204 and 205, respectively. A constant current source 206 is provided between the common connection of the transistors 202 and 203 and the ground, i.e. the connection terminal 200e. The emitter common connection is connected to the connection terminal 200g. A capacitor 209 serving as a filter means in cooperation with resistors 204 and 205 is connected between the connection terminal 200g and the ground. Preferably the capacitor 209 is connected not within but outside of the integrated circuit 200 as a discrete capacitor component. A phase shifting circuit 212 such as employed in the above described Australian Pat. No. 119,138 and German Pat. No. 1906957 is connected between the base electrodes, i.e. the connection terminals 200c and 200d, of the respective transistors 202 and 203 of the differential circuit 201. Accordingly, an AM signal voltage having a phase difference of 180° is developed between both ends of the phase shifting circuit 212, i.e. between the connection terminals 200c and 200d.

In operation, if and when the input terminal 200a of the integrated circuit 200 is supplied with an FM signal voltage from the FM signal source 1, the voltages e1 and e2 are developed at the connection terminals 200c and 200d. The voltage e1 becomes the maximum at the parallel resonance frequency fp of the capacitor 214 and the inductor 215 of the phase shifting circuit 212 and the voltage e2 becomes the maximum at the series resonance frequency fs of the phase shifting circuit 212. The respective frequencies fs and fp and f0 are expressed by the following equations (5) and (6) and (7), wherein it is assumed that the capacitance of the capacitor 213 is C213, the capacitance of the capacitor 214 is C214, and the inductance of the inductor 215 is L215.

$$fs = \frac{1}{2\pi\sqrt{L215(C213 + C214)}} \quad (5)$$

$$fp = \frac{1}{2\pi\sqrt{L215 C214}} \quad (6)$$

$$f0 = \frac{1}{2\pi\sqrt{L215\left(C214 + \frac{C213}{2}\right)}} \quad (7)$$

Figure 6A:
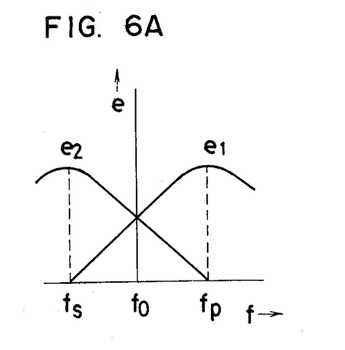
FIGS. 6A and 6B are similar to FIGS. 4A and 4B but shows graphs for explaining the operation of the present invention.
Figure 6B:
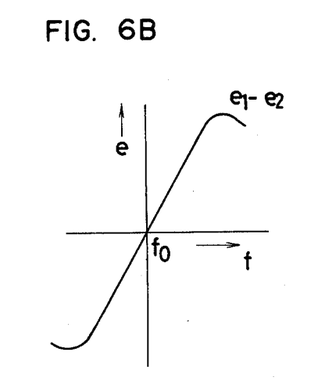

The respective voltages e1 and e2 of the connection terminals 200c and 200d are shown in FIG. 6A. Accordingly, in the embodiment shown in FIG. 5, the FM signal is converted into an AM signal as shown in FIG. 6B.

If and when there is an ample separation between the carrier frequency and the modulation frequency, the value of the capacitance of the externally connected capacitor 209 can be selected to be a value large enough to exhibit an impedance which allows for bypassing with respect to the carrier and does not allow for bypassing with respect to the modulating wave. If the value of the capacitor 209 is thus selected, the respective transistors 202 and 203 of the differential circuit 201 serve as rectifiers with respect to the carrier signal, so that the same operates as a differential amplifier with respect to a modulating wave signal. Accordingly, the voltages e1 and e2 as converted into the AM signal are rectified through the base-emitter junctions of the respective transistors 202 and 203 and are smoothed by means of the emitter resistors 204 and 205 and the capacitor 209. Thus, the rectified demodulated signal is differentially amplified by the respective transistors 202 and 203 of the differential circuit 201, whereby a detected output is obtained at a load resistor 208. The detected output as obtained at a load resistor 208 is filtered by means of the capacitor 216 and as a result only a modulating wave signal is applied to a subsequent stage low frequency amplifying circuit.

Now consider a case where in the FIG. 5 embodiment the carrier signal as amplitude modulated with a low frequency signal is applied to the detecting circuit i.e. the input terminal 200a. Then the modulated wave signal as rectified by the base-emitter junctions of the transistors 202 and 203 of the differential circuit 201 are of the same phase and, since the capacitor of the filter means was implemented as the capacitor 209 which is common to the respective transistors 202 and 203, no output is obtained at the load resistor 208 by virtue of a differential amplifying function of the differential circuit 201. More specifically, since the signals of the same phase and of the same amplitude are applied to the differential circuit 201, these are offset. Since in the embodiment shown the smoothing capacitor 209 was implemented as a discrete capacitor component connected externally of the integrated circuit 200, it is possible to set the capacitance value thereof to render the detected output constant. Accordingly, in comparison with such a conventional one as shown in FIG. 3, degradation of AM suppression by virtue of diversity of the capacitance values and diversity of the capacitance ratio of the smoothing capacitor can be improved.

Figure 7:
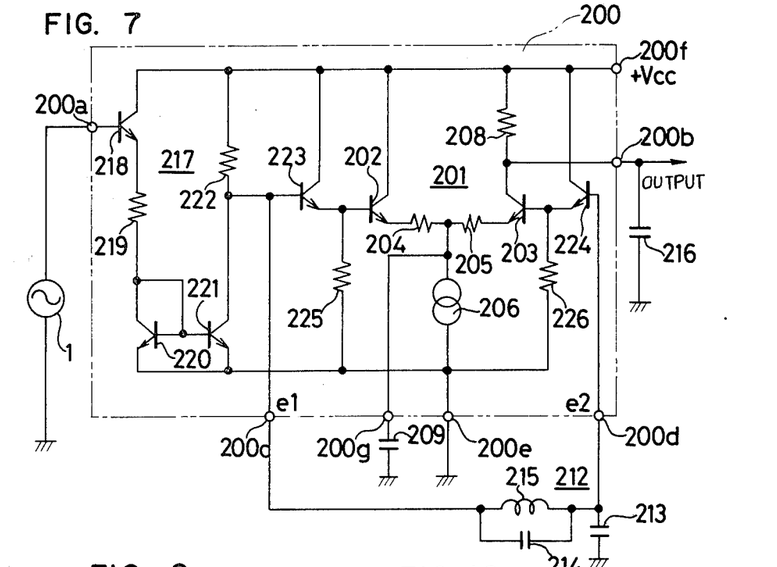
FIG. 7 is a schematic diagram of a preferred embodiment of the present invention.

FIG. 7 is a schematic diagram of a major portion of a preferred embodiment of the present invention. The embodiment shown is different from the FIG. 5 embodiment only in the following respects. More specifically, although in the FIG. 5 embodiment the signal voltage from the FM signal source 1 was applied as an input to the differential circuit 201, in the FIG. 7 embodiment the signal voltage from the FM signal source 1 is converted into a signal current in the integrated circuit 200 and is then applied to the differential circuit 201. To that end, a current mirror circuit 217 is employed. The current mirror circuit 217 is used to convert the voltage signal to a current signal associated with the magnitude of the voltage, as well known to those skilled in the art. More specifically, the signal path including the transistor 220 and the signal path including the transistor 221 become symmetrical to each other and accordingly the currents flowing into both of these signal paths become of the equal magnitude which is proportional to the magnitude of the input voltage signal. The signal current as converted by the above described current mirror circuit 217 is further applied to an emitter follower connected in symmetry to the input of the differential circuit 201. The emitter follower is constituted by the transistors 223 and 224 and the resistors 225 and 226. Accordingly, the phase shifting circuit 212 for rendering the voltages e1 and e2 applied to the inputs of the differential circuit 201 to be of the reverse phase is connected to the respective inputs of the emitter follower transistors 213 and 214. Such emitter follower circuits are provided to enhance and adjust the detection gains and these transistors 223 and 224 do not perform at all a rectifying operation, as is different from those transistors 102 and 105 of the FIG. 3 conventional circuit.

Referring to FIGS. 8A to 8D, a description will be made of the fact that the transistors 223 and 224 of the emitter follower do not perform a rectifying operation. It is pointed out that the resistance values of the resistors 225 and 226 shown in FIG. 7 are selected to be of about 5.1 K$\Omega$ and the resistance values of the resistors 204 and 205 are selected to be of about 270$\Omega$. The externally connected capacitor 209 is selected to be of a capacitance value of 1000 pF, which is approximately the same as that in the FIG. 5 embodiment. The capacitance values of the respective capacitors 213 and 214 of the phase shifting circuit 212 are selected to be of approximately 12 pF and 68 pF, respectively, and the inductance value of the inductor 215 is selected to be of approximately 16 mH. As seen from FIG. 7, no capacitance component has been connected to the emitter electrodes of the emitter follower transistors 223 and 224. However, an extremely small capacitance, say approximately 4 pF, of such as input capacitances of the transistors 203 and 204 of the differential circuit 201 is connected in terms of an equivalent circuit.

Figure 8A:
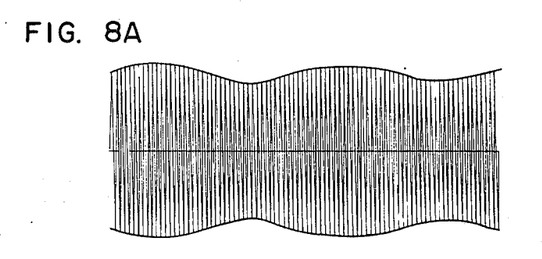
FIGS. 8A to 8D are graphs for explaining the operation of the FIG. 7 embodiment.
Figure 8B:
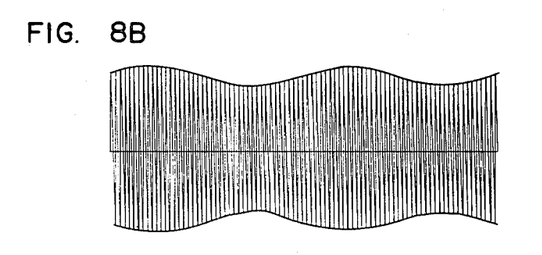
Figure 8C:
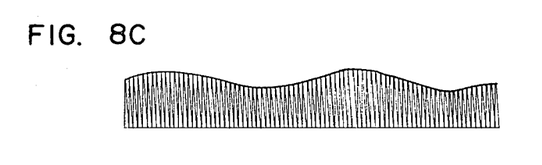
Figure 8D:
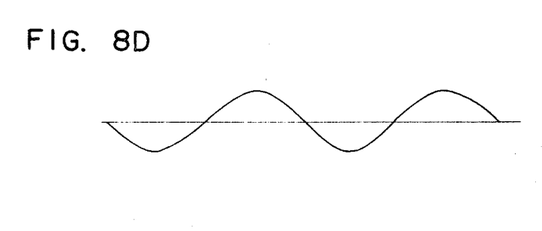

These transistors 223 and 224 operate as an emitter follower for the reasons to be described in the following. More specifically, the base potentials, say 2.7 V, of the transistors 223 and 224 are values that are sufficiently large with respect to the peak value of the signal voltage, say 0.9 V peak to peak. The transistors 223 and 224 each operates such that the emitter current thereof is approximately 0.4 mA and the base-emitter voltage $V_{BE}$ is 0.7 V. The time constant of an integration circuit formed by the resistances of the emitter resistors 225 and 226 of the transistors 223 and 224, respectively, and the input capacitances of the transistors 202 and 203 is approximately 0.02 μs and the said value is sufficiently large with respect to the carrier frequency, say 4.5 MHz and accordingly the input signal wave form is very little integrated by the integration circuit. FIG. 8A shows the voltage e1 applied to the base electrode of the transistor 223 and FIG. 8B shows an input to the emitter electrode of the emitter follower transistor 223 and thus the transistor 203 of the differential circuit 201. As seen from FIGS. 8A and 8B, the transistor 223 (224) does not perform at all a rectifying operation but merely serves as an impedance converting means. A signal as rectified, as shown in FIG. 8C, appears at the emitter electrode of one transistor 202 of the differential circuit 201 and a modulated wave signal, as shown in FIG. 8D, is withdrawn from the output of the circuit, i.e. from the collector electrode of the transistor 203. As seen from FIGS. 8A, 8B and 8C, the transistors 223 and 224 provided at the preceding stage of the differential circuit 201 do not perform a rectifying operation but merely serve as an emitter follower. Further, as in case of the FIG. 5 embodiment, the rectifying operation is performed only by the base-emitter junctions of the transistors 202 and 203 constituting the differential circuit 201. Thus, it will be appreciated that the FIG. 7 embodiment is also totally different from the FIG. 3 conventional one.

Figures 9, 10, 11:
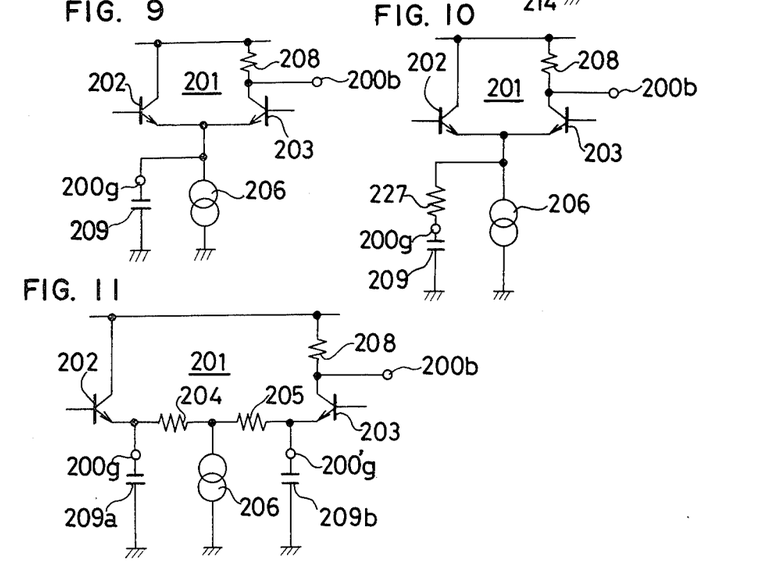
FIGS. 9, 10 and 11 are schematic diagrams of different embodiments of filter means for use in the present invention.

FIGS. 9 to 11 show schematic diagrams of different embodiments of a filter circuit for use in the present invention. In the FIG. 9 embodiment, the emitter resistors 204 and 205 of the embodiments shown in FIGS. 5 and 7 have been omitted, the emitter electrodes of the transistors 202 and 203 constituting the differential circuit 201 have been directly and commonly connected, the common connection being connected through the connection terminal 200g to the capacitor 209. In the FIG. 10 embodiment, the emitter resistors 204 and 205 in terms of the embodiments shown in FIGS. 5 and 7 have been employed as a common emitter resistor 227, which is connected between the external connection terminal 200g and the common emitter path of the respective transistors 202 and 203. In the FIG. 11 embodiment, the single capacitor 209 is formed in the respective transistors 202 and 203 of the differential circuit 201 as two capacitors 209a and 209b, and two external connection terminals 200g and 200g' are provided in the integrated circuit 200 for the above described two capacitors 209a and 209b. The external connection terminal 200g is connected to the common emitter path of the transistors 202 and 203, i.e. the emitter electrode of the transistor 202 and the external connection terminal 200g' is connected to the common connection path, i.e. the emitter electrode of the transistor 203. Furthermore, the emitter electrodes are commonly connected through the emitter resistors 204 and 205. Thus, various modifications and changes can be made for such filter means for use in the present invention. According to the experimentation made by the inventors of the present invention, it has been observed that in the FIG. 9 embodiment the characteristic concerning a distortion factor is slightly degraded.

Although the present invention has been described and illustrated in detail, it is clearly understood that the same is by way of illustration and example only and is not to be taken by way of limitation, the spirit and scope of the present invention being limited only by the terms of the appended claims.

What is claimed is:

1. An FM detecting circuit for discriminating an FM signal comprising:
   differential and detector circuit means including a pair of transistors, each having first, second and third electrodes, wherein said second electrodes are commonly coupled to a reference potential through a constant current source of relatively high impedance;
   a discriminator network means for converting the FM signal to two AM signals of substantially opposite phase;
   input means for coupling said discriminator network means to said first electrodes, thereby applying said AM signals to the respective first electrodes of said pair of transistors in substantially an opposite phase relationship;
   filter means comprising capacitor means connected between the common coupling of said second electrodes and the reference potential, wherein the capacitance of said capacitor means has a value sufficient to pass the carrier signal of said FM signal and does not pass low frequency signals;
   means for coupling said third electrodes to a voltage source; and
   output means for withdrawing a detected output from said third electrode of at least one of said pair of transistors of said differential and detector circuit means.

2. An FM detecting circuit in accordance with claim 1, which further comprises
   impedance converting means connected in symmetry to the respective first electrodes of said pair of transistors of said differential circuit means, whereby AM signals from said input means are applied to said impedance converting means, said discriminator network means being interposed between the inputs of said impedance converting means.

3. An FM detecting circuit in accordance with claim 2, wherein said impedance converting means comprises emitter follower circuit means.

4. An FM detecting circuit in accordance with any one of claims 1, 2 or 3 wherein said filter means includes resistor means connected in series with said capacitor means.

5. An FM detecting circuit in accordance with claim 1 wherein said filter means includes resistor means connected between said second electrode of one of said transistors and said common coupling of said second electrodes.

6. An FM detecting circuit for discriminating an FM signal comprising:
   differential and detector circuit means including a pair of transistors, each having first, second and third electrodes, wherein said second electrodes are commonly coupled to a reference potential through a constant current source of relatively high impedance;
   a discriminator network means for converting the FM signal to two AM signals of substantially opposite phase;
   input means for coupling said discriminator network means to said first electrodes, thereby applying said AM signals to the respective first electrodes of said pair of transistors in substantially an opposite phase relationship;

filter means including resistor means for coupling said second electrodes to the common coupling of said second electrodes and capacitor means connected between the common coupling of said second electrodes and a reference potential, wherein the capacitance of said capacitor means has a value sufficient to pass the carrier signal of said FM signal and does not pass low frequency signals;

means for coupling said third electrodes to a voltage source; and output means for withdrawing a detected output from said third electrode of at least one of said pair of transistors of said differential and detector circuit means.

7. An FM detecting circuit for discriminating an FM signal comprising:

differential and detector circuit means including a pair of transistors, each having first, second and third electrodes, wherein said second electrodes are commonly coupled to a reference potential through a constant current source of relatively high impedance;

a discriminator network means for converting the FM signal to two AM signals of substantially opposite phase;

input means for coupling said discriminator network means to said first electrodes, thereby applying said AM signals to the respective first electrodes of said pair of transistors in substantially an opposite phase relationship;

filter means including resistor means for coupling said second electrodes to the common coupling of said second electrodes and capacitor means connected between each of said second electrodes and the reference potential, wherein the capacitance of said capacitor means has a value sufficient to pass the carrier signal of said FM signal and does not pass low frequency signals;

means for coupling said third electrodes to a voltage source; and output means for withdrawing a detected output from said third electrode of at least one of said pair of transistors of said differential and detector circuit means.

8. An FM detecting circuit in accordance with any one of claims 1, 6 or 7 wherein:

said discriminator network means comprises:

parallel circuit means including an inductance element and a first capacitor, and a second capacitor connected in series with said parallel circuit, one end of said second capacitor being connected to the reference potential, the respective first electrodes of said pair of transistor means being connected to respective ends of said parallel circuit means.

* * * * *